United States Patent
Powers et al.

(10) Patent No.: US 7,214,452 B2
(45) Date of Patent: May 8, 2007

(54) USING PERFLUOROPOLY-ETHERS TO FORM PELLICLES

(75) Inventors: James M. Powers, Aloha, OR (US); Robert P. Meagley, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 170 days.

(21) Appl. No.: 10/289,611

(22) Filed: Nov. 7, 2002

(65) Prior Publication Data

US 2004/0091788 A1  May 13, 2004

(51) Int. Cl.
*G03F 9/00* (2006.01)

(52) U.S. Cl. .................. 430/5; 156/272.2; 428/14; 428/421; 428/422

(58) Field of Classification Search ............ 428/14, 428/421, 422; 156/272.2; 430/5
See application file for complete search history.

(56) References Cited

U.S. PATENT DOCUMENTS

| | | | | |
|---|---|---|---|---|
| 5,061,024 A | * | 10/1991 | Keys | 359/350 |
| 5,168,001 A | * | 12/1992 | Legare et al. | 428/194 |
| 5,286,567 A | * | 2/1994 | Kubota et al. | 428/422 |
| 5,686,522 A | * | 11/1997 | Tonelli et al. | 524/539 |
| 6,280,885 B1 | * | 8/2001 | Gordon | 430/5 |
| 6,770,404 B1 | * | 8/2004 | Wheland et al. | 430/5 |
| 7,022,437 B2 | * | 4/2006 | Cummings | 430/5 |

* cited by examiner

*Primary Examiner*—Christopher G. Young
(74) *Attorney, Agent, or Firm*—Trop, Pruner & Hu, P.C.

(57) ABSTRACT

Exposure systems may use pellicles made of perfluoropoly-ether. These materials may exhibit reduced darkening upon repeated exposures compared to other materials.

8 Claims, 2 Drawing Sheets

USING PERFLUOROPOLY-ETHERS TO FORM PELLICLES

BACKGROUND

This invention relates generally to fabrication of integrated circuits.

In the fabrication of integrated circuits, a mask is used to repeatedly illuminate a large number of wafers. An exposure system may be used to transfer a pattern on the mask repeatedly to one wafer after another.

To protect the mask, a frame may be positioned around the mask. Radiation that illuminates the mask may pass through a transparent pellicle attached to the frame. The frame and pellicle define a chamber that maintains a clean environment around the mask. This reduces the need to clean the mask, reducing damage to the mask from cleaning steps.

Existing 157 nanometer pellicles suffer from short lifetimes due to photochemical darkening induced by exposure to photons. Particularly, 157 nanometer pellicles use fluoropolymer materials which have relatively short lifetimes. One micron thick film existing materials typically transmit about 95 percent of the incident 157 nanometer radiation. This means there is an absorbence of about 0.02 per micron. The relatively high energy of the 157 nanometer photon is sufficient to break most chemical bonds. Thus, this absorbence leads to pellicle degradation, over a relatively short lifetime.

Thus, there is a need for better ways to form pellicles for advanced exposure systems.

DETAILED DESCRIPTION

Figure 1:
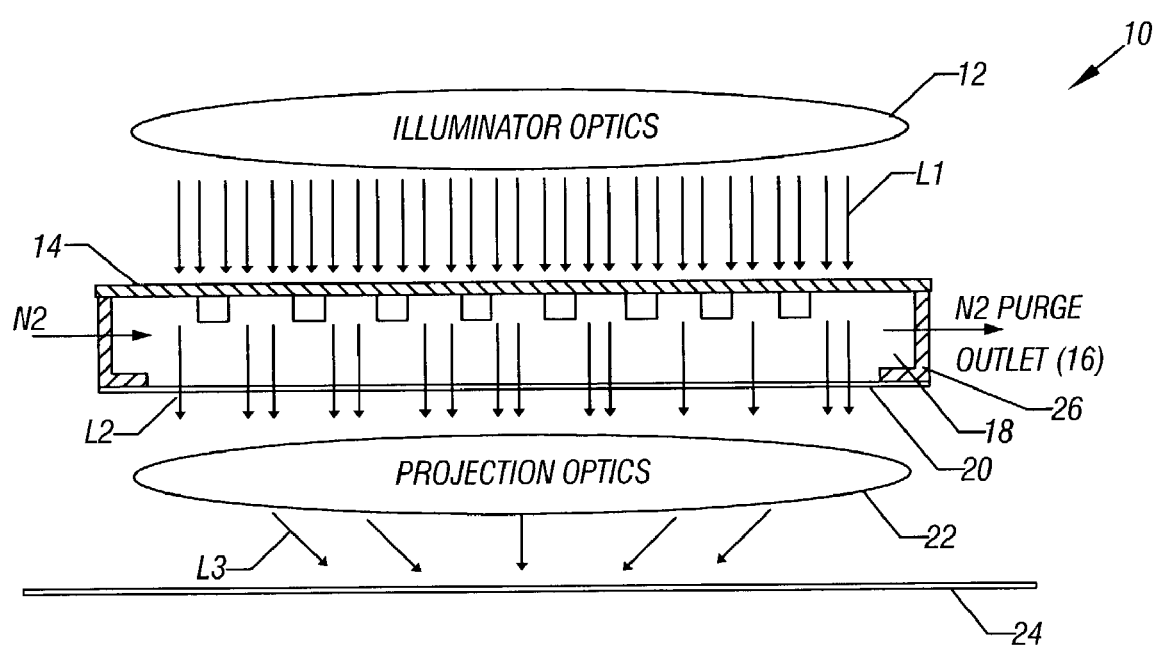
FIG. 1 is a schematic cross-sectional view of one embodiment of the present invention.

Referring to FIG. 1, an exposure system 10 includes illuminator optics 12 that generate a radiation beam L1 to expose a mask 14 having features thereon. The illuminator optics 12 may be any system including a system that uses wavelengths of 157 nanometers. After being exposed, the radiation beam L2 extends through a chamber 18 defined by a frame 26 and a pellicle 20. The radiation L2 then passes through projection optics 22 to form the radiation L3 that exposes a wafer 24.

While an embodiment is depicted in FIG. 1 in which the entire mask 14 is exposed simultaneously, the present invention is also applicable to systems which scan the beam L across the mask. The system 10 also includes a nitrogen purge system with a nitrogen inlet into the chamber 18 and an outlet 16. Nitrogen purges may be used where high absorbence of oxygen and water found in the atmosphere occurs.

The pellicle 20 is formed using polymers based on perfluoropoly-ethers that, in liquid form, exhibit low absorbence to 157 nanometer radiation. Perfluoropoly-ethers have been shown to have high transparency and chemical inertness for use in immersion lithography (see M. Switkes and M. Rothschild, J. Vac. Sci. Technol. B 19(6), November/December 2001).

Typically, perfluoropoly-ethers are formulated as oils or lubricants, not as solids. At lower molecular weights, perfluoropoly-ethers are liquids, while at higher molecular weights they can be used as lubricating waxes.

Commercially available perfluoropoly-ethers may use straight chain polymers. Existing perfluoropoly-ethers include $CF_3-[(O-CF_2-CF_2)_a-(O-CF_2)_b]-O-CF_3$, which is commercially available as Fomblin® Z, distributed by Ausimont USA, Inc., Thorofare, N.J. Another commercially available perfluoropoly-ether, $CF_3-[(O-CF(CF_3)-CF_2)_a-(O-CF_2)_b]-O-CF_3$ is sold as Fomblin® Y, also available from Ausimont. Other forms of perfluoropoly-ethers may also be applied, including $CF_3-[(O-CF_2-CF_2-CF_2)_a-(O-CF_2)_b]-O-CF_3$, commercially available as Demnum® from Daikin America Orangeburg, N.Y.

The Fomblin® Z shows better stability under 157 nm. illumination, most probably due to the lack of branching $CF_3$ groups found in the Fomblin® Y formulation. It is postulated that the presence of the $CF_3$ groups in the Fomblin® Y allows for the formation of mobile $CF_3$ radicals that can easily move within the polymer, leaving a chemically active radical site on the main chain of the polymer. This radical site can react with other polymer sites and give unwanted chemical reaction. Thus, in general, it is believed to be desirable to provide sufficient cross-linking of the perfluoropoly-ether chains without creating sites for unwanted photochemistry.

Cross-linking of perfluoropoly-ether materials using functionalized Fomblin® may improve the physical properties of the fabricated membranes due to an increase in the molecular weight and more constrained molecular motion. An example of one cross-linking scheme, shown in FIG. 2, uses cross-linked Fomblin® Z.

Figure 2:
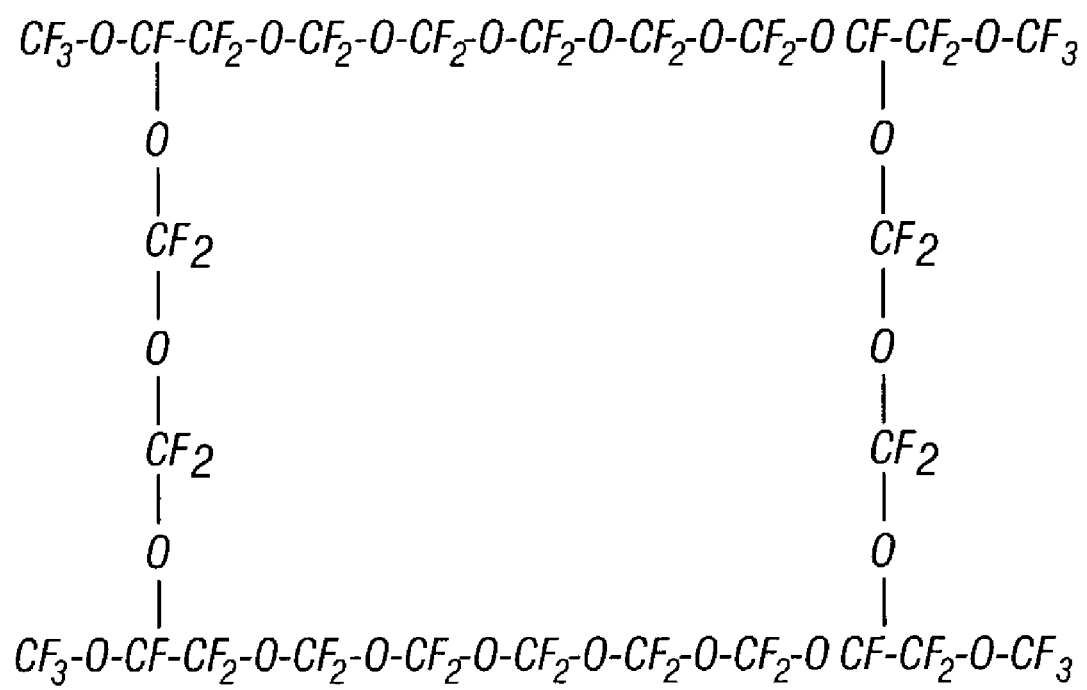
FIG. 2 is a depiction of a perfluoropoly-ether that is suitable in one embodiment of the present invention.

In order to link perfluoropoly-ether chains, as shown in FIG. 2, functionalized Fomblin® derivatives may be used. For example, the backbone may be derived from $Rf-[CF_2-(O-C_2F_4)-(OCF_2)-OCF_2]-Rf$, where Rf are functional groups. Examples of suitable Fomblin® Z formulations include Fomblin® Z-DOL, where Rf is $-CH_2OH$, Fomblin® Z DIAC, where Rf is $-COOH$, and Fomblin® Z DEAL, where Rf is $-COOR_H$. Additional functional groups, Rf, that may be used include olefin, epoxide, and oxetane.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a pellicle having a polymer including a solidified, straight chained fully perfluorinated backbone.

2. The method of claim 1 including forming a pellicle with cross-linked perfluoropoly-ether.

3. The method of claim 2 including forming a cross-linked perfluoropoly-ether pellicle using functionalized perfluoropoly-ether.

4. The method of claim 1 including forming a pellicle with cross-linked perfluoropoly-ether including di-functional groups selected from the group including $CH_2OH$, COOH, and COOR, where R can be any moiety.

5. A pellicle comprising:
   a polymer having a solidified, straight chained fully perfluorinated backbone.

6. The pellicle of claim 5 wherein said polymer is cross-linked.

7. The pellicle of claim 6 wherein said cross-linked polymer is formed from di-functionalized intermediates.

8. The pellicle of claim 7 wherein said di-functionalized intermediates include functional groups selected from the group including olefin, epoxide, oxetane, $CH_2OH$, COOH, and COOR, where R may be any moiety.

* * * * *